United States Patent [19]

Holmes

[11] 4,125,772
[45] Nov. 14, 1978

[54] SCANNING ELECTRON MICROSCOPE WITH EDDY-CURRENT COMPENSATION

[75] Inventor: Duane C. Holmes, San Jose, Calif.

[73] Assignee: American Optical Corporation, Southbridge, Mass.

[21] Appl. No.: 841,629

[22] Filed: Oct. 13, 1977

[51] Int. Cl.² .............................................. G21K 1/08
[52] U.S. Cl. .............................. 250/396 ML; 250/311
[58] Field of Search ..................... 250/311, 397, 396

[56] References Cited

U.S. PATENT DOCUMENTS

| 2,617,041 | 11/1952 | Fleming | 250/311 |
| 3,371,206 | 2/1968 | Takizawa | 250/391 |

OTHER PUBLICATIONS

Deflection Signal Generator for Electron Machines by Lindsay et al., "Microelectronics & Reliability," Pergamon Press, vol. 9, No. 4, pp. 345–347.

Primary Examiner—Harold A. Dixon
Attorney, Agent, or Firm—Jeremiah J. Duggan; Howard R. Berkenstock, Jr.

[57] ABSTRACT

In a scanning charged particle microprobe such as a scanning electron microscope, means for generating an exponentially decaying electrical signal and means for generating a step function signal to be summed and applied to the microprobe to cause it to deflect in a step function compensated for the effects of eddy current induced fields.

2 Claims, 11 Drawing Figures

SCANNING ELECTRON MICROSCOPE WITH EDDY-CURRENT COMPENSATION

BACKGROUND OF THE INVENTION

A problem which is solved by this invention relates to correcting a form of electron beam deflection distortion which is encountered during the high magnification operation of a scanning charge particle microprobe, such as in a scanning electron microscope. It is theorized that this distortion may be caused by the inherent change in electrical or magnetic fields which are utilized to cause the required deflection of the microprobe for "stereo" operation during the scanning of the beam over a specimen under examination. Because of the sensitivity of this small electron probe to the effects of changing fields, small electrostatic or magnetic fields produce identifiable deflection of the probe. I have discovered that due to the inherent nature of a changing magnetic field inducing an eddy current in any electrical conductor through which the field passes, an inherent distortion is introduced into the microprobes deflection system as during the deflection of the beam for different incident angle viewing.

The very existence of the eddy current which has been unintentionally induced in the conductors making up the deflection system in turn causes a magnetic field in the general system which opposes the change of the original field. If, therefore, the initial field which is applied to the electron beam is sufficient to cause the previously calculated desired deflection, the opposition to that field generated by the above described unwanted currents induced within the field will cause the previously calculated field to be insufficient for the original deflection desired. Thus, it becomes apparent that inherent within the microscope system is a somewhat insidious field generator which tends to defeat a part of the original objective of the total system.

SUMMARY OF THE INVENTION

A magnetic field changing in amplitude induces an eddy current in any electrical conductor through which it passes. The eddy current in turn causes a magnetic field that opposes the change of the original field. Thus, the total magnetic field at any one point in space is the sum of the original field and the opposing eddy current induced field. The eddy current of the original field decays exponentially as does its induced magnetic field. Since the eddy current decay may be represented as the sum of several exponential decaying functions, that sum may be applied to the original field generating signal to produce a field producing current or voltage which compensates for its own induced eddy current error producing effect so that a step function field may be applied to a charged particle microprobe already compensated for error.

DESCRIPTION OF THE DRAWINGS

By reference to the drawings further appreciation of the problem faced and the solutions thereto will be had. In this connection.

Continuing, now, with further discussion of the background of the invention, it must be borne in mind that the problems induced by this eddy current field phenomenom went unappreciated in scanning electron microscopy, until the advent of split screen stereoscopic scanning electron microscopy as is taught by U.S. Pat. No. 3,986,027, assigned to the Assignee of the present application. Further, it was not appreciated until such split screen stereoscopic scanning electron microscopy became utilized at very high magnifications and the relative fields used for deflecting the electron beam during scanning became very large with respect to the fields used to scan the beam in the traditional raster pattern. It was not until the apparatus illustrated in the afore-mentioned U.S. Pat. No. 3,986,027 was built and operated that the problem described herein was appreciated. Thus, the solution for this problem was conceived of and is described herein as having special relationship with the continuing development of electron microprobe systems incorporating a beam of sufficiently high brightness (content of energy) so that high speed scanning of specimens (e.g. scanning at rates comparable to those exhibited by commercial television systems) might become a reality. With these improvements, "real time" scanning electron microscopes having high magnification viewable on TV screens have become a standard laboratory tool for the scientists.

With the advent of such TV-linked systems have come a number of changes in the style and practice of electron microscopy. The electron beam having a high concentration of electrons can be finely focused (to a spot diameter of a few Angstroms) and caused to scan the specimen surface in synchronism with an electron beam CRT monitor. Reference to such U.S. Pat. Nos. 3,678,333; 3,842,272; 3,925,664; 3,931,519 and 4,020,387 illustrate such systems and the above-mentioned patents are assigned to the Assignee of the present application.

Figure 1:
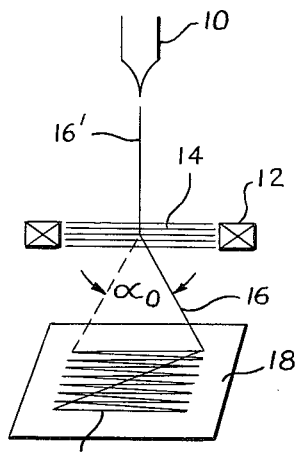
FIG. 1 is a schematic representation in block diagram form of a scanning electron microscope incorporating the invention.

In such systems, as is illustrated in FIG. 1, an electron microprobe is generated from a tip 10 and is scanned by coils 12 developing a magnetic or electrostatic field therebetween as at 14. This field causes the electron microprobe 16 to be scanned according to the predetermined changing field pattern over the specimen surface 18 in the raster pattern illustrated at 20.

The impact of the electron beam upon the specimen within the microscope can be detected by any of a variety of devices (X-ray detectors, back scattered electron detectors, etc.) and the signal of such devices used to modulate the brightness of the TV tube beam. In the case of very high brightness sources for electron beams (field emission tips as described in the previously mentioned patents) sufficient signal-to-noise level can be maintained such that even at very high magnification (such as 50,000 times or more) a real time TV rates can and display may be utilized.

Scientists and researchers have found tremendous advantage in being able to immediately view on a TV screen a highly magnified specimen surface to compare and select the areas of relative interest and the determination of suitable sites for photomicrographs. As the interest in highly magnified specimen examinations forces higher magnification and resolution of photomicrographs, advantages provided by the developments within the segment of scanning electron microscopy with "real time" viewing have become available as building blocks for further advance in the state of the art of field emission scanning electron microscopy. For example, as TV monitors having high resolution (higher number of lines) and a variety of times of persistence phosphors have become available, the scan of the electron beam on the specimen has still been synchronizable with the TV type monitor with the result of improvements in high performance of the total system.

It has also been determined that a variety of additional information may be gained from the specimen if while scanning the specimen for in a particular response mode (e.g. angle of impingement, secondarily or back scattered electron detector, X-ray mapping) in direct comparison with a collateral specimen response (such as above or scanning transmission bombardment) additional information might be gained from the specimen. The ability of the field emission microprobe system to respond with real time response lends additional advantages to the above investigations, particularly for simultaneous comparative viewing such as in stereoscopic type of presentation. Such advantage led to the development of the previously identified U.S. Pat. No. 3,986,027 wherein two immediate images were compared such that simultaneous viewing provided the viewer with information beyond that available from single images. Particularly in those situations where separate images of objects were formed such that when these reviewed in particular relation stereopsis was observed. In such situations the viewer can gain depths of information which cannot be obtained from the single image. With the development of the electron microscope art, such that separate coordinative photomicrographs might be prepared and later compared in suitable viewing devices such that the stereoscopic information can be extracted.

In the described scanning electron microscope and display system which is adaptable to stereoscopic or side-by-side image comparison on TV-type monitors the apparatus may include means for scanning the microprobe beam in a raster over a specimen and displaying the image on the cathode ray tube. Additionally, the beam scan is synchronized to that of the beam CRT and the CRT beam synchronized in horizontal scan such that it is blanked over portions of the extent of the scan of such sequential fields to provide the requisite different angle of incidence and thus the stereoscopic image generations. In this stereo viewing, the angle of incidence of the microprobe is varied in relation to blanking sequence to provide side-by-side images on the CRT. These are generated from different microprobe incidence angles. Thus the generated side-by-side images may then be viewed with a stereo viewer or other means to achieve the desired stereoscopic affect. It will be appreciated that in providing the different angles of incidence of illumination of the specimen surface that the electron beam generating such illumination must be deflected to different angles to provide these angles of incidence.

Figure 2A:
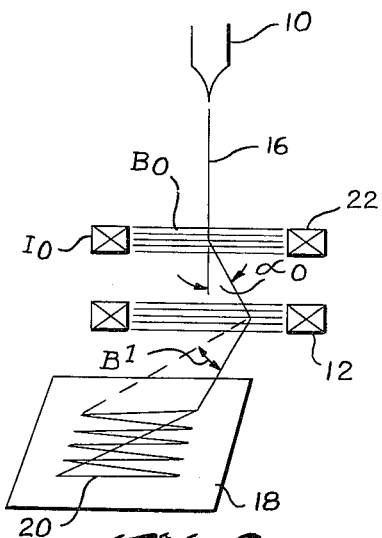
FIGS. 2A and 2B are a pictoral representation of the scanning of the electron beam in the generation of a stereoscopic image of a specimen in a scanning electron microscope.
Figure 2B:
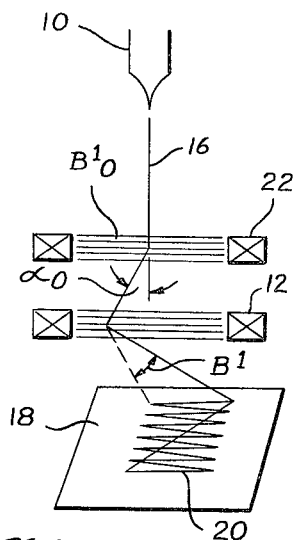

By reference to the FIGS. 2a and 2b, it may be seen that the field emission tip 10 provides again an electron beam 16 which illuminates a specimen surface 18 and the beam may be scanned back and forth by coils 12 to form the identified raster pattern 20. These elements may be clearly identified in both FIG. 2a and 2b. It may be appreciated, however, in looking at the FIGS. 2a and 2b that additional magnetic coils are inserted 22 which cause the basic beam 16 to be deflected in 2a to the right by an angle "alpha" and FIG. 2b to the left by a comparable angle "alpha". It may be seen that the visual image will be viewed in the case of FIG. 2a as from a right hand viewing of the deflected beam 16 and scan through the angle data across the specimen surface in the identified raster. By comparison, in FIG. 2b the second angle of incidence is generated such that the specimen is viewed as it were "from the left" and by the electron beam 16 by being deflected to the left and in turn scanned back across the raster pattern 20 through an angle $B_1$. With this background information, the subsequently described problem which resulted in the solution from the invention in the present application would be better appreciated.

Figure 3:
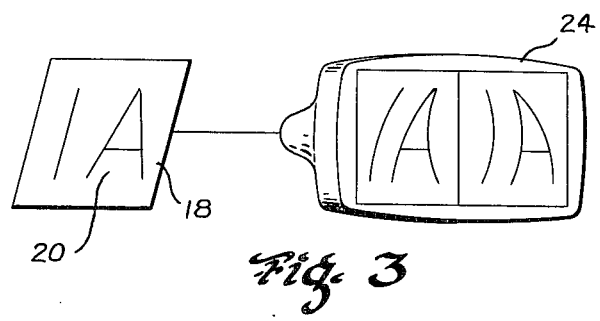
FIG. 3 is a pictoral representation of the problem solved by the present invention.

In conjunction with the utilization of the identified stereoscopic scanning electron microscope in the preparation of ultra high magnification photomicrographs, distortions in the micrographs were noted as illustrated in FIG. 3. In the case where a specimen 18 contained a special area to be scanned by a raster pattern 20 such as the identified character "A", it was noted that presentation on the cathode ray tube 24 appeared as a deflected distorted version of the known shape of the identified feature of the specimen (e.g. FIG. 3). After viewing such images as is illustrated on the cathode ray tube 24 determination was made that the phenomenom being observed had marked similarity to a portion of the hysteresis loop. This led to the development of the following investigation which provided the invention of the present application.

Figure 4A:
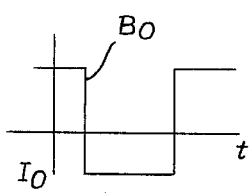
FIGS. 4A, 4B and 4C are an illustration of the waveforms of magnetic flux in the deflection coils of a scanning electron beam system.

Charge particle beam such as that illustrated at 16 in FIGS. 1 and 2 traverses a straight path as illustrated at 16' when no deflecting fields (either electrostatic or electromagnetic) are present. By introduction of a constant amplitude magnetic field $B_0$ deflection of the electron beam 16 through an angle $\alpha_0$ occurs. This is illustrated in FIG. 2a. In the instance where no metal is within the path of the magnetic field $B_0$, the total magnetic field $B_0$ will be proportional to the amplitude of the drive current $I_0$ which passes through the deflecting coil 22 to set up the field and cause the deflection at $\alpha_0$. This concept is illustrated in FIG. 4a where it will be seen that as a rather straight line response for the field $B_0$ where a square wave current $I_0$ is utilized in deflecting coils.

DESCRIPTION OF A PREFERRED EMBODIMENT

Recognizing the foregoing to be the theoretical situation, the problem of the instant invention occurs wherein metallic materials are introduced into the region of the interaction of the magnetic field $B_0$. These metallics may occur within the deflecting coil structure 22 or within any of the numerable parts to the scanning electron microscope such as housing, support materials and the like. When this situation occurs, as it does in practice, then a change $dB_0$ in the amplitude of the magnetic field $B_0$ occurring within a sufficiently small time interval introduces an eddy current $I_1$ in metallic particles or metallic structures such that the resulting magnetic field $B_1$ opposes the direction of the change in field $dB_0$.

The net magnetic field at any time in such a situation may be expressed as $B = B_0(t) \pm B_1(t_1 (dB_0/dt))$ If a fixed deflection of the electron beam 16 is desired then a constant $B_0$ is not necessarily sufficient field condition.

The application of the field $B_0$ to cause the deflection causes the generation of the opposing eddy current and thus any resulting $B_1$ component must die off prior to the attainment of the full deflection of the beam through the angle $\alpha_0$. This decay will be an exponential function and to a first order $B_1$ will equal $Ke^{-g dB_t/dt}$, g is decay constant dependent upon conductivity of the electrically conducting material. It may be inconvenient to wait this necessary time for the field to stabilize and in such instance then $B_0$ itself must be modified to contain a component that will effectively cause the cancellation of the opposing field $B_1$. This is the approach which has been taken in the present invention. To compensate for the unwanted and destructive eddy current fields illustrated in this specific more detailed illustration certain additional features are included in the regulatory circuit which are nonadvantageous in specific applications.

It will be realized that recognition of the problem of the spurrious effect of the induced eddy current fields represents a substantial portion of the invention which is herein described. Reference now to FIG. 4a illustrates the waveform of the intended current in the deflection coils such as 22 (FIG. 2) if there is no unwanted field present. Measurement of the actual field B existing in the area of the coils 22 revealed the waveform represented in FIG. 4b.

Figure 4B:
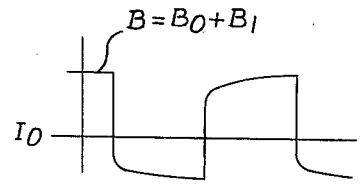
Figure 4C:
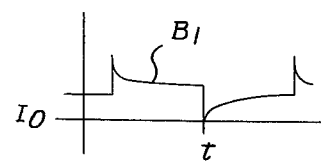
Figure 5A:
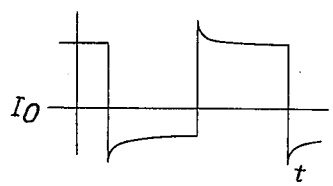
FIGS. 5A, 5B and 5C are an illustration of desired waveforms for the scanning coils of a scanning electron beam system.
Figure 5B:
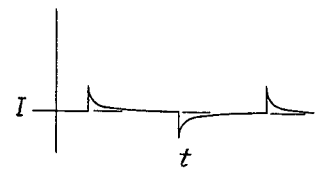
Figure 5C:
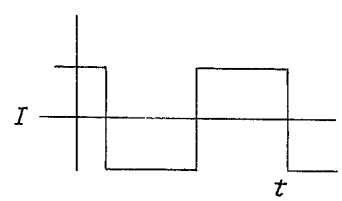

Knowing the information of FIGS. 4a and 4b, I deduced that the nature of the unwanted fields producing the distortions illustrated in FIG. 3 were of the form represented by FIG. 4c. Study of the curve of the field current of FIG. 4c suggests that characteristic of decaying exponential fields. Bearing this in mind, I concluded that I could generate a field current having segments of decay similar to the observed current characteristics causing the inferior operation of the microscope. It occurred that if the supplied deflection currents in the form of the wave illustrated in FIG. 5a, and the previously experienced degraded wave form (FIG. 5b) were allowed to be superimposed to form the artificial deflection current wave form, FIG. 5c, one could achieve a field having the required square form for sharp, undistorted images (FIG. 5c).

With the above information derived, a circuit according to the following parameters will provide the requisite correction for the field to overcome the negative effects of the eddy currents which are induced.

Figure 6:
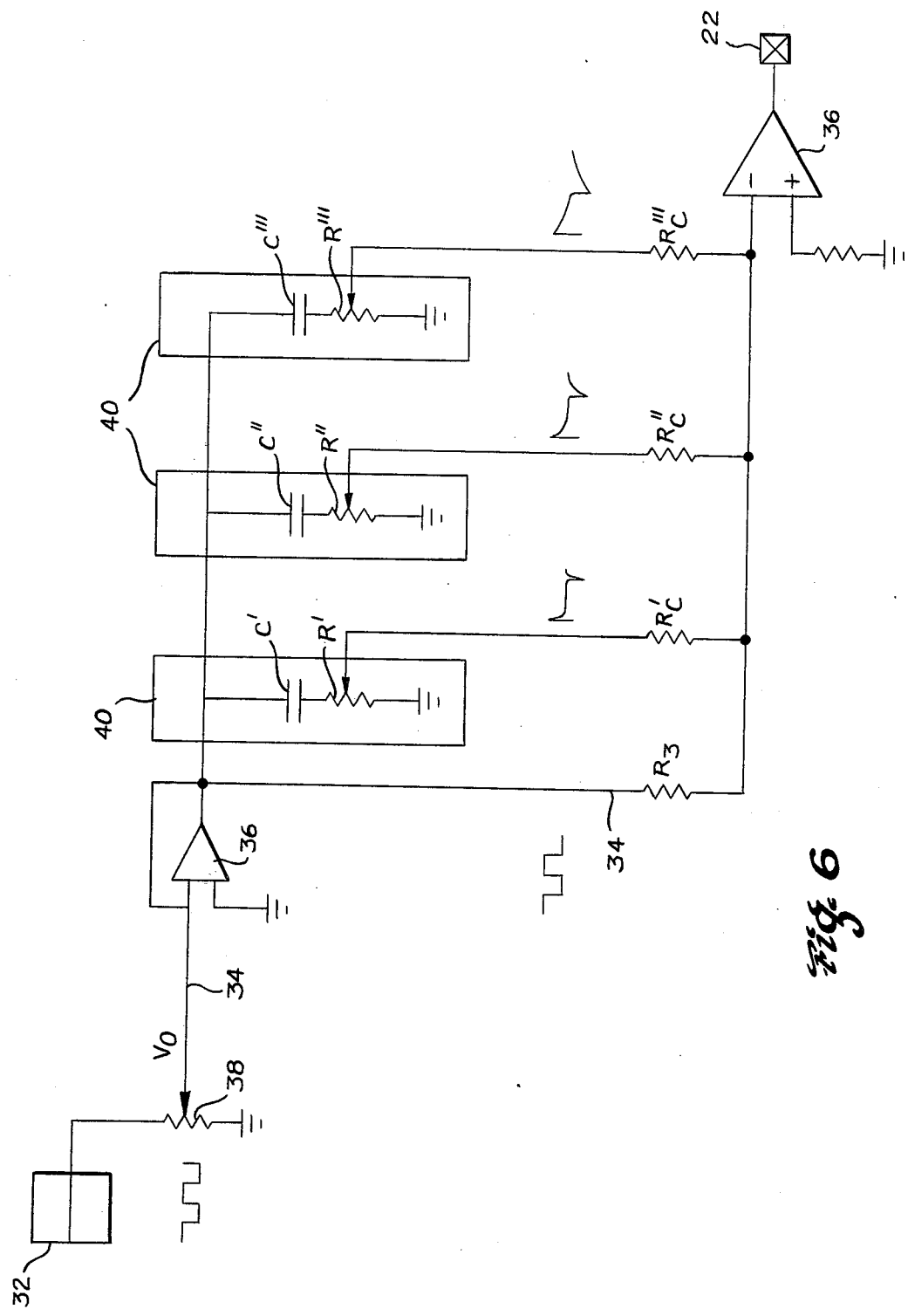
FIG. 6 is a schematic diagram of a circuit for correction the flux in the scanning coils of a scanning electron beam system.

Referring now to FIG. 6, a circuit for the generation of the required curves illustrated in FIG. 5 is illustrated. The basic drive voltage for supplying the square wave for the field deflection is produced in square wave generator 32. This voltage $V_o$ is supplied along line 34 to buffer amplifier 36 and is output to a deflection coil such as 22 (FIG. 2). A variable potentiometer or other conventional means 38 may be included to provide adjustable control over the reference voltage $V_o$. In the illustrated embodiment three exponential voltage wave generating circuits 40 are provided to simulate the observed eddy current effect on the deflection field. These circuits each include conventional RC components, the time constant of which is varied to provide the desired wave form. In the individual exponential wave form generators 40', 40'' and 40''', R', R'' and R''' and capacitors C', C'', and C''', typically have values of 5 kiloohms and 0.1 to 3 microfarads to provide wave forms as illustrated superimposed over this structure, with value of $V_o$ being in the range of 1 to 10 volts. For coupling practice, Resistors $R_c$ are included, which maybe about 10 kiloohms.

It should be understood that the number of individual exponential circuits may be varied, as well as the values of components therein to closely approximate the waveform of the exponential signal of the eddy current impact. The amplitude of the corrective waveform varies according to:

$$V = k\, V_o/\omega CR(e^{-t/RC})$$

This disclosed deflection correction circuit is applicable with properly selected component values to correct any beam deflection system where the error in time induced by the eddy current delay is of the same order of magnitude as the required control time. Likewise, in the adaptation of the present circuit to meet the design needs of particular systems, numerous other variations of the illustrated apparatus may be accomplished. It, however, should also be appreciated that these may properly be considered as falling within the spirit and scope of the present invention.

I claim:

1. In a scanning charged particle microprobe system including a source of charged particles, means for collimating said particles into a beam, means for scanning said beam in a predetermined raster over a specimen in said microprobe system, detector means including means for generating a signal proportional to charged particles detected and recording means connected to said detector means to record detection of charged particles exiting the surface of said specimen, the improvement comprising:
means for generating a step function electrical signal connected to said scanning means and applying said signal to said means for scanning said beam thereby to deflect said beam, means for generating an exponentially decaying electrical signal connected to said step function generating means whereby the sum of said step function and said exponential electrical signals eliminate eddy current losses generated by said step function signal when applied to said means for scanning said beam.

2. The improvement of claim 1 wherein said means for generating a exponentially decaying electrical signal includes a plurality of RC circuits connected in parallel with said step function generating means.

* * * * *